(12) United States Patent
Lall et al.

(10) Patent No.: US 6,433,602 B1
(45) Date of Patent: Aug. 13, 2002

(54) HIGH SPEED SCHMITT TRIGGER WITH LOW SUPPLY VOLTAGE

(75) Inventors: Ravindar M. Lall; Trent Whitten, both of Portland; John Jiang, Hillsboro, all of OR (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

(21) Appl. No.: 09/651,689

(22) Filed: Aug. 30, 2000

(51) Int. Cl.[7] .................................................. H03K 3/12
(52) U.S. Cl. ........................................ 327/205; 327/206
(58) Field of Search .................................. 327/108, 112, 327/170, 205, 206, 281, 288, 534, 537; 326/21, 24, 27, 34, 87, 31, 81, 83, 85

(56) References Cited

U.S. PATENT DOCUMENTS

| | | | |
|---|---|---|---|
| 3,984,703 A | 10/1976 | Jorgensen | |
| 4,539,489 A * | 9/1985 | Vaughn | 327/206 |
| 4,825,420 A * | 4/1989 | Min | 365/230.08 |
| 5,063,313 A * | 11/1991 | Kikuda et al. | 327/170 |
| 5,386,153 A * | 1/1995 | Voss et al. | 326/34 |
| 5,534,798 A * | 7/1996 | Phillips et al. | 326/108 |
| 5,594,361 A * | 1/1997 | Campbell | 326/24 |
| 5,770,960 A * | 6/1998 | Iadanza et al. | 327/281 |
| 5,869,978 A * | 2/1999 | Hong | 326/24 |
| 6,023,174 A * | 2/2000 | Kirsch | 326/34 |
| 6,060,925 A | 5/2000 | Chou | |

* cited by examiner

Primary Examiner—Matthew Smith
Assistant Examiner—Paul Dinh

(57) ABSTRACT

A CMOS Schmitt Trigger circuit design provides a relatively high speed device having a tight, substantially monotonic hysteresis characteristic which is substantially independent of fabrication process parameters and can be used with relatively wide power supply designs, including operating a relatively low Vcc. Tight trip point variation is maintained in conjunction with process, voltage, and temperature changes. The circuit is adaptable for forming an integrated circuit buffer element.

15 Claims, 2 Drawing Sheets

HIGH SPEED SCHMITT TRIGGER WITH LOW SUPPLY VOLTAGE

BACKGROUND OF THE INVENTION

1. Field of the Invention

The present invention relates generally to electrical circuits, more specifically to integrated circuit ("IC") buffers, and more particularly to a high speed complementary metal oxide silicon ("CMOS") buffer with monotonic hysteresis capable of working with a very low power supply voltage ("Vcc"), yet having a small trip point range.

2. Description of Related Art

A Schmitt Trigger is an electronic circuit well known in the state of the art and often used to turn a signal having a slow or asymmetrical transition into a signal with a sharp transition region. Schmitt Triggers are useful of IC inputs to clean up input change signals and to do signal level transitions. However, a Schmitt Trigger is generally slower than an inverter circuit of the same operational power. Moreover, a Schmitt trigger uses more current because several wide, big, integrated circuit elements are simultaneously in an ON-state for a relatively long time period. In practice they are not easily optimized for high speed circuitry and they do not provide a "monotonic" hysteresis (never increasing nor decreasing as independent variables increase or decrease) over a wide range of integrated circuit power supply potential, Vcc, range (e.g., about 1.4-volts to 3.6-volts); the lower the Vcc, the worse the performance. In fact, in the state of the art of IC design the call for lower power consumption in much denser IC chip designs is constant; Vcc is being reduced at a much faster rate than in the past.

FIG. 1 (Prior Art) is an electrical schematic for a conventional Schmitt Trigger. Four, stacked, parallel input, metal-oxide-silicon field effect transistors ("MOSFET") P1, P2, N1, and N2 are coupled by their respective gate electrodes to the trigger input ("IN"); respective source/drain electrodes are connected in series. Based on the transition of the signal IN, one of the pair will generate a signal ("Vfp" or "Vfn" where "Vf" is determined by the transistor size ratio P3/P1 and N3/N1) to the related respective output transistor P3 or N3, connected to generate the output signal "OUT" having a sharp, clean transition between levels. In operation, if the output node, OUT, is low, then the p-channel output transistor P3 is ON and the n-channel output transistor N3 is OFF; the p-channel input transistors P2, P3 dictate the trip point. If the output is HIGH, the output n-channel transistor N3 is ON and the p-channel output transistor P3 is OFF; the n-channel input transistors N2, N3 dictate the trip point; and, p-channel input transistors P1, P2 are ON, providing a direct current ("DC") path to Vcc. Assuming that OUT is HIGH and that IN is LOW, the n-channel input transistors N1 and N2 are OFF and the n-channel output transistor N3 is ON. The node at Vfn floats to Vfn=Vcc−Vtn, where Vt is transistor turn-on voltage; thus, If the IN signal has a voltage, Vin, less than the Vtn of the n-channel input transistor N1 (Vin<Vtn1), Vfn remains at Vcc14 Vtn. As Vin increases, n-channel input transistor N1 begins to turn on and Vfn starts to fall toward Vss, where Vss is zero volts. The trip point is defined when Vin=Vtn2+ Vfn, that is, when n-channel input transistor N2 starts to turn ON. As the second n-channel input transistor N2 turns ON, the output starts to move toward Vss, causing the n-channel output transistor N3 to start turning OFF. In turn, this causes Vfn to fall, turning the n-channel input transistor N2 further toward its ON state. This continues until the n-channel output transistor N3 is totally OFF and both n-channel input transistors N1, N2 are totally ON. This "positive feedback" causes the trip point to be well defined. At the HIGH trip point Vfn=Vtrip−Vtn. Since the n-channel input transistor N2 is used as a switch, it has a size much bigger than the other n-channel transistor N1. This inherently makes the switching slower. (A similar analysis applies to the p-channel side of this Schmitt Trigger when IN is HIGH and OUT is LOW). By its design, it is not adaptable to high speed functionality since effective switching resistances of MOSFETS are difficult to reduce without changing the trip point. The circuit hysteresis is dependent on Vcc and at very low Vcc levels does not work properly.

FIG. 2 shows a more compact circuit design for another conventional Schmitt Trigger. A basic inverter latch circuit is employed in which two series connected transistor pairs P1/N1 and P2/N2 provide a higher speed performance. However, the switching point voltages of this circuit design are more difficult to predict, especially with respect to keeping a monotonic hysteresis over a wide range of Vcc. Input transistors P1 and N1 size ratio dictates the nominal trip point. The input transistors P1, N1 are relatively large devices for speed, having relatively short channel lengths; whereas, output transistors P2, N2 are relatively small devices with relatively long channel lengths. When IN is LOW, the first stage output, "OUT$_A$," is HIGH and the second stage output, "OUT$_B$," is LOW, turning the p-channel output transistor P2 ON. As the input rises, the n-channel input transistor N1 has to overcome not only the bias of the p-channel input transistor P1 where Vgs ("gate-source") is reducing, but also a weak sized p-channel output transistor P2 where Vgs=Vcc. When IN is going HIGH to LOW, initially OUT$_A$ is LOW and OUT$_B$ is HIGH. MOSFET N2 is ON and MOSFET P2 is OFF. MOSFET P1 starts to turn ON and has to overcome MOSFET N2 where Vgs=Vcc and MOSFET N1. Thus, the main P1/N1 inverter has to fight P2/N2 reducing transition speed substantially. While this circuit is faster than that shown in FIG. 1, there are substantive fabrication issues. The mismatch in size between the input and output transistors relates directly to a mismatch in respective Vt; this causes more process variations on the trip points and hysteresis characteristic. Again, with a wide range Vcc designs, the hysteresis is not monotonic and trip points are difficult to define.

There is a need to have an IC input buffer design adaptable to a supply voltage which can vary in order to provide a common interface at the chip boundary. The input buffer design should provide relatively high speed (that is, have a low signal propagation delay time) have a hysteresis that is relatively independent of process Vcc and is substantially monotonic regardless of Vcc change.

SUMMARY OF THE INVENTION

In its basic aspects, the present invention provides a CMOS Schmitt Trigger device including: an input stage forming an inverter, having a pair of input stage CMOS devices, for receiving an input signal; and an output stage, having a first output stage device in parallel with the input stage, the first output stage device having a pair of first output stage CMOS devices coupled to the input stage CMOS devices such that the pair of second stage CMOS devices add to the respective input stage CMOS devices only one at time for changing the trip point of the Schmitt Trigger device, and having a second output stage device connected to the first output stage device for driving an output node.

In another aspect, the present invention provides an integrated circuit buffer device having a circuit input node and a circuit output node, including: connected to the circuit input node, an inverter circuit first stage having a first trip point; connected to the inverter circuit first stage, an inverter circuit second stage wherein said second stage is additive to said inverter circuit first stage for changing said trip point and wherein said first stage and said second stage are connected in parallel having a first output node; an inverter connecting said first output node to said circuit output node; and connected in series to the inverter circuit second stage, a output stage device connected to the circuit output node, wherein said output stage device has discrete component sizes substantially greater than discrete component sizes of the inverter circuit first stage and second stage such that a substantially monotonic hysteresis characteristic and tight trip point tolerance is established for said buffer device.

In yet another aspect, the present invention provides an integrated circuit having an input buffer having a plurality of Schmitt Trigger circuits, each of said Trigger circuits including: a trigger input node; coupled to the trigger input node, a first stage CMOS inverter having a first p-channel MOSFET and a first n-channel MOSFET, wherein size ratio of the input stage first p-channel MOSFET to first n-channel MOSFET determines a trip point of the first stage; coupled to the first stage CMOS input inverter, a second stage CMOS inverter having a second p-channel MOSFET and a second n-channel MOSFET, wherein a ratio of first stage MOSFET size to second stage MOSFET size determines trip point of the Schmitt Trigger device, said second stage having a second stage output node; a trigger output node; an inverter coupling the second stage output node to the trigger output node; and coupled to the second stage CMOS inverter and to said trigger output node, a CMOS output stage, wherein said output stage has discrete component sizes substantially greater than discrete component sizes of the inverter first stage and second stage, wherein a substantially monotonic hysteresis characteristic and tight trip tolerance is established for each of said Schmitt Trigger circuits.

Some of the advantages of the present invention are:
it provides a relatively high speed CMOS input buffer design;
it provides a Schmitt Trigger which has a hysteresis that is substantially monotonic with Vcc changes;
the resultant circuit has a hysteresis that is fabrication process independent;
it provides a predictable Schmitt trigger adaptable to very low power supply voltage circuits; and
it provides a Schmitt trigger that has less trip point variation; in other words, the trip point range tolerance is tighter.

The foregoing summary and list of advantages is not intended by the inventors to be an inclusive list of all the aspects, objects, advantages and features of the present invention nor should any limitation on the scope of the invention be implied therefrom. This Summary is provided in accordance with the mandate of 37 C.F.R. 1.73 and M.P.E.P. 608.01 (d) merely to apprise the public, and more especially those interested in the particular art to which the invention relates, of the nature of the invention in order to be of assistance in aiding ready understanding of the patent in future searches. Other objects, features and advantages of the present invention will become apparent upon consideration of the following explanation and the accompanying drawings, in which like reference designations represent like features throughout the drawings.

The drawings referred to in this specification should be understood as not being drawn to scale except if specifically annotated.

DESCRIPTION OF THE PREFERRED EMBODIMENT

Reference is made now in detail to a specific embodiment of the present invention, which illustrates the best mode presently contemplated by the inventors for practicing the invention. Alternative embodiments are also briefly described as applicable. The convention "chip" is used hereinafter for an integrated circuit device.

Figure 1:
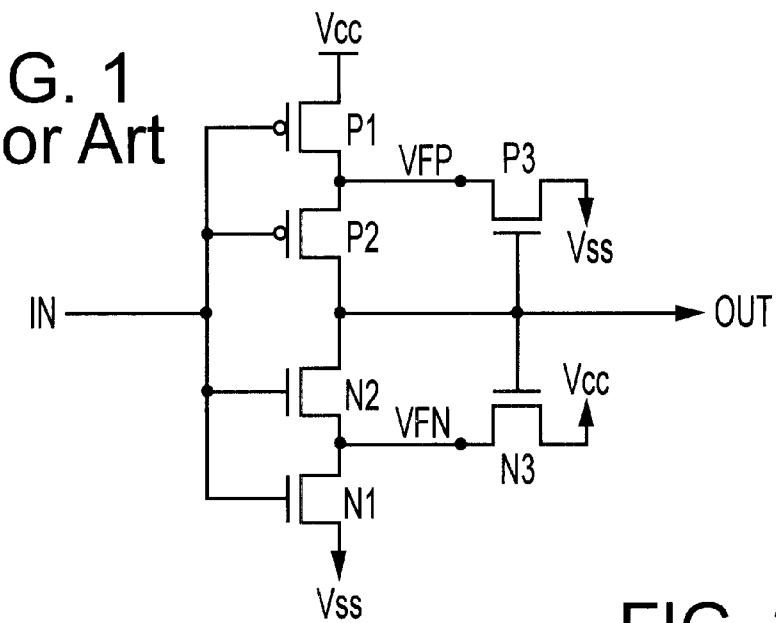
FIG. 1 (PRIOR ART) is an electrical schematic diagram of a conventional Schmitt Trigger first embodiment.
Figure 2:
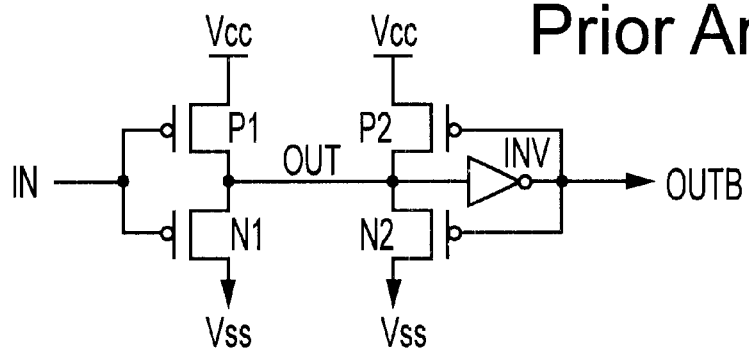
FIG. 2 (PRIOR ART) is an electrical schematic diagram of a conventional Schmitt Trigger second embodiment.
Figure 3:
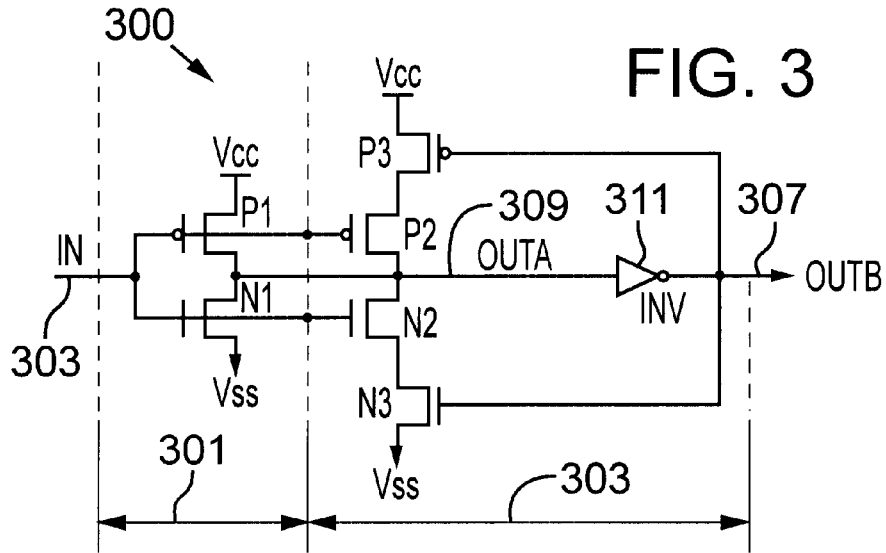
FIG. 3 is a generic electrical schematic diagram for a Schmitt Trigger in accordance with the present invention.
Figure 4:
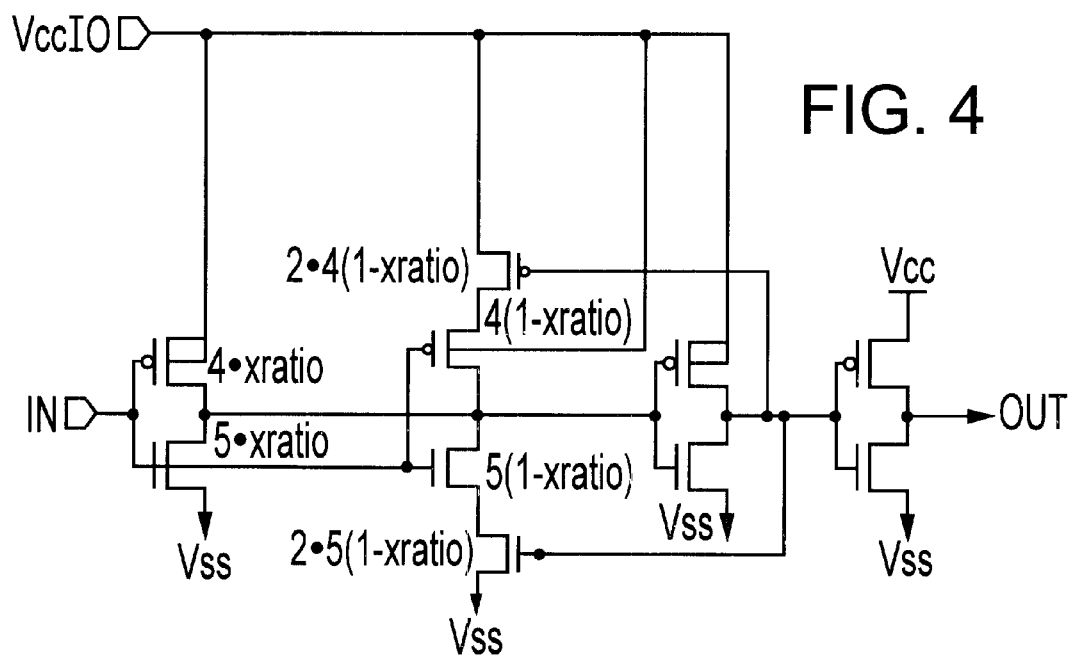
FIG. 4 is a specific electrical schematic diagram for an exemplary preferred embodiment of a Schmitt Trigger in accordance with the present invention.

FIG. 3 is a generic electrical schematic diagram for a Schmitt Trigger circuit 300 in accordance with the present invention and FIG. 4 is a specific electrical schematic diagram for a preferred embodiment of a Schmitt Trigger in accordance with the present invention. A CMOS Schmitt Trigger circuit design in accordance with the present invention provides a relatively high speed device having a tight and substantially monotonic hysteresis characteristic Which is substantially independent of fabrication process parameters and can be used with relatively wide power supply designs, including operating at a relatively low chip power supply potential, Vcc. The circuit is adaptable for forming an integrated circuit buffer element.

The input stage 301 of the circuit 300 is an inverter; two MOSFET input devices P1, N1 are stacked in parallel with each having a gate electrode connected to the circuit input line 303, the input signal being represented by the word "IN." The source electrodes are connected to Vcc and Vss. The size ratio of the input devices P1/N1 defines the trip point of the input inverter stage 301.

An output stage 305 of the circuit 300 includes a stack of four cross-coupled MOSFET output devices P2, P3, N2, N3 electrically connected to the input stage 301. The source-drain electrodes of these four devices are series connected with the source of potential Vcc. A first pair P2/N2 of the complementary devices has respective gate electrodes electrically connected to the gate electrodes of the input devices P1, N1. The second pair P3/N3 of the complementary devices have respective gate electrodes connected to a circuit output line 307. The P-side and N-side of the CMOS circuit 300 are mutually connected via metallization trace 309 through an inverter 311 to the circuit output line 307.

The first pair P2/N2 of complementary devices in the output stage 305 are switched ON depending on the level of the IN signal, and hence signal OUTB, such that they add to the respective input stage inverter devices P1/N1 only one at time. If device P3 is ON, the ratio becomes (P1+P2)/N1, causing a higher trip point. If device N3 is ON, the ratio becomes (P1/(N1+N2), providing a lower trip point. Thus, a trip point is dictated by changing the ratio of p-channel device/n-channel device, as opposed to the prior art where the respective complementary device are opposing one another (see Background, supra). As a result, switching the output, $OUT_B$, is substantially faster. Now, the hysteresis is defined by what the effective p-channel width is compared to the effective n-channel (or vice versa), relatively independent of the Vcc level. The ratio of device P1 channel width to device P2 channel width dictates by design the amount by which the HIGH trip point is affected from the base trip point of the inverter stage 301; the ratio of device N1 channel width to device N2 channel width dictates by design the amount by which the LOW trip point is affected from the base trip point. The net effect dictates the total hysteresis.

When the input is LOW, the node for $OUT_B$ on line 307 is LOW; device P3 is ON and N3 is OFF. When the input switches to HIGH, the trip point is set by the ratio of (P1+P2)/N1, which is a relatively higher trip point. Once so tripped, the node for $OUT_B$ goes HIGH, turning device N3 on and shutting device P3 OFF. This then lowers the trip point. Now when the input again goes LOW, the trip point is set by the ratio of P1/(N1+N2). Thus, for improved speed performance, output device N3 and output device P3 are sized approximately twice the size of device N2 and P2, respectively.

FIG. 4 is an exemplary implementation of the present invention showing relative device sizes employed.

Thus, the present invention provides a CMOS Schmitt Trigger circuit design provides a relatively high speed device having a tight, substantially monotonic hysteresis characteristic which is substantially independent of fabrication process parameters and can be used with relatively wide power supply designs, including operating a relatively low Vcc. Tight trip point variation is maintained in conjunction with process, voltage, and temperature changes. The amount of hysteresis is controlled by the respective ratio of the input n-type devices and the input p-type devices. The greater the hysteresis, the greater the slope of hysteresis curve with respect to Vcc variation. The circuit is adaptable for forming an integrated circuit buffer element.

The foregoing description of the preferred embodiment of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . . ".

What is claimed is:

1. A CMOS Schmitt Trigger device comprising:

an input stage forming an inverter, having a pair of input stage CMOS devices, for receiving an input signal; and an output stage, having a first output stage device in parallel with the input stage, the first output stage device having a pair of first output stage CMOS devices coupled to the input stage CMOS devices such that the pair of first output stage CMOS devices add to the respective input stage CMOS devices only one at a time for changing the trip point of the Schmitt Trigger device, and having a second output stage device connected to the first output stage device for driving an output node;

the input stage further includes a first p-channel MOSFET having a first p-channel width, and a first n-channel MOSFET having a first n-channel width, wherein a gate electrode of each said first p-channel MOSFET and said first n-channel MOSFET is individually connected to a device input trace, a source electrode of each said first p-channel MOSFET and said first n-channel MOSFET is connected to a source of electrical potential, and drain electrodes of each said first p-channel MOSFET and said first n-channel MOSFET are connected in series such that said first p-channel MOSFET and said first n-channel MOSFET form said inverter: and the output stage includes a second p-channel MOSFET having a second p-channel width, and a second n-channel MOSFET having a second n-channel width, wherein a gate electrode of said second p-channel MOSFET is connected to the gate of said first p-channel MOSFET and a gate electrode of said second n-channel MOSFET is connect to the gate electrode of said first n-channel MOSFET, and drain electrodes of each of said second p-channel MOSFET and second n-channel MOSFET are connected in series and to the drain electrodes of the first p-channel MOSFET and the first n-channel MOSFET, and a source electrode of said second p-channel MOSFET and second n-channel MOSFET is connected to a source of potential such that the second p-channel MOSFET and the second n-channel MOSFET form a second stage of said inverter; wherein the output stage has a third p-channel MOSFET having a third p-channel width, and a third n-channel MOSFET having a third n-channel width, wherein a gate electrode of each said third p-channel MOSFET and third n-channel MOSFET is separately connected to said output node, a source electrode of each said third p-channel MOSFET and third n-channel MOSFET is separately connected to said source of electrical potential, and a drain of each said third p-channel MOSFET and third n-channel MOSFET is respectively connected to a source electrode of said second p-channel MOSFET and second n-channel MOSFET, wherein the third n-channel width is approximately twice the second n-channel width, and the third p-channel width is approximately twice the second p-channel width.

2. The Schmitt Trigger device as set forth in claim 1, comprising:

size ratio of the input stage CMOS devices defines a trip point of the input stage.

3. The Schmitt Trigger device as set forth in claim 2, comprising:

the first output stage device having first output stage CMOS devices coupled to respective input stage CMOS devices such that a ratio of first input stage associated device channel width to first output stage associated device channel width dictates trip point of the Schmitt Trigger device.

4. The Schmitt Trigger device as set forth in claim 1, comprising:

said input stage and said output stage have discrete components of relative sizes for establishing a substantially monotonic hysteresis and tight trip point range characteristics for said Schmitt Trigger.

5. The Schmitt Trigger device as set forth in claim 1, comprising:
   the third n-channel width is substantially greater than the second object n-channel width, and
   the third p-channel width is substantially greater than the second p-channel width.

6. The Schmitt Trigger device as set forth in claim 1, comprising:
   a ratio of first p-channel MOSFET channel width to second p-channel MOSFET channel width dictates an amount by which LOW-to-HIGH trip point is affected from a base trip point of the inverter, and
   a ratio of first n-channel MOSFET channel width to second n-channel MOSFET channel width dictates an amount by which HIGH-to-LOW trip point is affected from the base trip point.

7. An integrated circuit buffer device having a circuit input node and a circuit output node, comprising:
   connected to the circuit input node, an inverter circuit first stage having a first trip point;
   connected to the inverter circuit first stage, an inverter circuit second stage wherein said second stage is additive to said inverter circuit first stage for changing said trip point and wherein said first stage and said second stage are connected in parallel having a first output node;
   an output inverter connecting said first output node to said circuit output node;
   connected in series to the inverter circuit second stage, a output stage device connected to the circuit output node, wherein said output stage device has discrete component sizes substantially greater than discrete component sizes of the inverter circuit first stage and second stage such that a substantially monotonic hysteresis characteristic and tight trip point tolerance is established for said buffer device: wherein first stage further includes a first p-channel MOSFET having a first p-channel width, and a first n-channel MOSFET having a first n-channel width, wherein a gate electrode of each said first p-channel MOSFET and said first -n-channel MOSFET is individually connected to a device input trace, a source electrode of each said first p-channel MOSFET and said first n-channel MOSFET is connected to a source of electrical potential, and drain electrodes of each said first p-channel MOSFET and said first n-channel MOSFET are connected in series such that said first p-channel MOSFET and said first n-channel MOSFET form said inverter, and
   wherein the output stage includes a second p-channel MOSFET having a second p-channel width, and a second n-channel MOSFET having a second n-channel width, wherein a gate electrode of said second p-channel MOSFET is connected to the gate of said first p-channel MOSFET and a gate electrode of said second n-channel MOSFET is connect to the gate electrode of said first n-channel MOSFET, and drain electrodes of each of said second p-channel MOSFET and second n-channel MOSFET are connected in series and to the drain electrodes of the first p-channel MOSFET and the first n-channel MOSFET, and a source electrode of said second p-channel MOSFET and second n-channel MOSFET is connected to a source of potential, such that the second p-channel MOSFET and the second n-channel MOSFET form a second stage of said inverter, and a third p-channel MOSFET having a third p-channel width, and a third n-channel MOSFET having a third n-channel width, wherein a gate electrode of each said third p-channel MOSFET and third n-channel MOSFET is separately connected to said output node, a source electrode of each said third p-channel MOSFET and third n-channel MOSFET is separately connected to said source of electrical potential, and a drain of each said third p-channel MOSFET and third n-channel MOSFET is respectively connected to a source electrode of said second p-channel MOSFET and second n-channel MOSFET.

8. An integrated circuit having an input buffer having a plurality of Schmitt Trigger circuits, each of said Trigger circuits comprising:
   a trigger input node;
   coupled to the trigger input node, a first stage CMOS inverter having a first p-channel MOSFET and a first n-channel MOSFET, wherein size ratio of the input stage first p-channel MOSFET to first n-channel MOSFET determines a trip point of the first stage;
   coupled to the first stage CMOS input inverter, a second stage CMOS inverter having a second p-channel MOSFET and a second n-channel MOSFET, wherein a ratio of first stage MOSFET size to second stage MOSFET size determines trip point of the Schmitt Trigger device, said second stage having a second stage output node;
   a trigger output node;
   an inverter coupling the second stage output node to the trigger output node;
   coupled to the second stage CMOS inverter and to said trigger output node, a CMOS output stage, wherein said output stage has discrete component sizes substantially greater than discrete component sizes of the inverter first stage and second stage, wherein a substantially monotonic hysteresis characteristic and tight trip tolerance is established for each of said Schmitt Trigger circuits; wherein first stage further includes a first p-channel MOSFET having a first p-channel width, and a first n-channel MOSFET having a first n-channel width, wherein a gate electrode of each said first p-channel MOSFET and said first -n-channel MOSFET is individually connected to a device input trace, a source electrode of each said first p-channel MOSFET and said first n-channel MOSFET is connected to a source of electrical potential, and drain electrodes of each said first p-channel MOSFET and said first n-channel MOSFET are connected in series such that said first p-channel MOSFET and said first n-channel MOSFET form said inverter: and
   wherein the output stage includes a second p-channel MOSFET having a second p-channel width, and a second n-channel MOSFET having a second n-channel width, wherein a gate electrode of said second p-channel MOSFET is connected to the gate of said first p-channel MOSFET and a gate electrode of said second n-channel MOSFET is connect to the gate electrode of said first n-channel MOSFET, and drain electrodes of each of said second p-channel MOSFET and second n-channel MOSFET are connected in series and to the drain electrodes of the first p-channel MOSFET and the first n-channel MOSFET and a source electrode of said second p-channel MOSFET and second n-channel MOSFET is connected to a source of potential, such that the second p-channel MOSFET and the second n-channel MOSFET form a second stage of said inverter, and a third p-channel MOSFET having a third p-channel width, and a third n-channel MOSFET having a third n-channel width, wherein a gate electrode of each said third p-channel MOSFET and third n-channel MOSFET is separately connected to said output node, a source electrode of each said third p-channel MOSFET and third n-channel MOSFET is separately connected to said source of electrical potential, and a drain of each said third p-channel MOSFET and third n-channel MOSFET is respectively connected to a source electrode of said second p-channel MOSFET and second n-channel MOSFET.

9. A Schmitt Trigger device comprising:
a first stage, including a first inverter coupled to an input node for the device, the inverter having a first p-channel MOSFET coupled to a first n-channel MOSFET; and
a second stage, including a second p-channel MOSFET having its gate and drain coupled respectively to the gate and drain of the first p-channel MOSFET and a second n-channel MOSFET having its gate and drain coupled respectively to the gate and drain of the first n-channel MOSFET, the drains of the first and second p- and n-channel MOSFETs coupled together at an intermediate node for the device, a second inverter coupled between the intermediate node and an output node for the device, and a third p-channel MOSFET coupled between the source of the second p-channel MOSFET and an electrical potential source and a third n-channel MOSFET coupled between the source of the second n-channel MOSFET and an electrical potential source, the gates of the third p-channel MOSFET and third n-channel MOSFET coupled to the output node, wherein the third n-channel MOSFET has a n-channel width substantially greater than a second n-channel MOSFET n-channel width, approximately twice the second n-channel MOSFET n-channel width, and the third p-channel MOSFET has a p-channel width substantially greater than a second p-channel MOSFET p-channel width, approximately twice the second p-channel MOSFET p-channel width.

10. The Schmitt Trigger device as set forth in claim 9, comprising:
a ratio of first p-channel MOSFET channel width to second p-channel MOSFET channel width dictates an amount by which LOW-to-HIGH trip point is affected from a base trip point of the inverter, and
a ratio of first n-channel MOSFET channel width to second n-channel MOSFET channel width dictates an amount by which HIGH-to-LOW trip point is affected from the base trip point.

11. A Schmitt Trigger device comprising:
a first stage, including a first inverter coupled to an input node for the device, the inverter having a first p-channel MOSFET coupled to a first n-channel MOSFET; and
a second stage, including a second p-channel MOSFET having its gate and drain coupled respectively to the gate and drain of the first p-channel MOSFET, the drains of the first and second p-channel MOSFETs coupled together at an intermediate node for the device, a second inverter coupled between the intermediate node and an output node for the device, and a third p-channel MOSFET coupled between the source of the second p-channel MOSFET and an electrical potential source, the gate of the third p-channel MOSFET coupled to the output node, wherein the third p-channel MOSFET p-channel width is approximately twice the second p-channel MOSFET p-channel width.

12. A Schmitt Trigger device comprising;
a first stage, including a first inverter coupled to an input node for the device, the inverter having a first p-channel MOSFET coupled to a first n-channel MOSFET; and
a second stage, including a second n-channel MOSFET having its gate and drain coupled respectively to the gate and drain of the first n-channel MOSFET, the drains of the first and second n-channel MOSFETs coupled together at an intermediate node for the device, a second inverter coupled between the intermediate node and an output node for the device, and a third n-channel MOSFET coupled between the source of the second n-channel MOSFET and an electrical potential source, the gate of the third n-channel MOSFET coupled to the output node, wherein the third n-channel MOSFET n-channel width is approximately twice the second n-channel MOSFET n-channel width.

13. A Schmitt Trigger device comprising:
a first stage including a first inverter coupled to an input node for the trigger circuit, the inverter consisting of a first p-channel MOSFET coupled to a first n-channel MOSFET, the source of the first p-channel MOSFET coupled directly to a first electrical potential source and the source of the first n-channel MOSFET coupled directly to a second electrical potential source; and
a second stage including:
    a second p-channel MOSFET having its gate and drain coupled respectively to the gate and drain of the first p-channel MOSFET, the drains of the first and second p-channel MOSFETs coupled together at an intermediate node for the trigger circuit;
    a second inverter coupled between the intermediate node and an output node for the trigger circuit; and
    a third p-channel MOSFET coupled between the source of the second p-channel MOSFET and the first electrical potential source, the gate of the third p-channel MOSFET coupled to the output node.

14. A Schmitt Trigger device comprising:
a first stage including a first inverter coupled to an input node for the trigger circuit, the inverter consisting of a first p-channel MOSFET coupled to a first n-channel MOSFET, the source of the first p-channel MOSFET coupled directly to a first electrical potential source and the source of the first n-channel MOSFET coupled directly to a second electrical potential source; and
a second stage including;
a second n-channel MOSFET having its gate and drain coupled respectively to the gate and drain of the first n-channel MOSFET, the drains of the first and second n-channel MOSFETs coupled together at an intermediate node for the trigger circuit;
a second inverter coupled between the intermediate node and an output node for the trigger circuit; and
a third n-channel MOSFET coupled between the source of the second n-channel MOSFET and the second electrical potential source, the gate of the third n-channel MOSFET coupled to the output node.

15. The Schmitt Trigger device as set forth in claim 14, comprising:

a second p-channel MOSFET within the second stage, the second p-channel MOSFET having its gate and drain coupled respectively to the gate and drain of the first p-channel MOSFET, the drains of the first and second p-channel MOSFETs coupled together at the intermediate node; and a third p-channel MOSFET coupled between the source of the second p-channel MOSFET and the first electrical potential source, the gate of the third p-channel MOSFET coupled to the output node.

* * * * *

UNITED STATES PATENT AND TRADEMARK OFFICE
CERTIFICATE OF CORRECTION

PATENT NO. : 6,433,602 B1  
DATED : August 13, 2002  
INVENTOR(S) : Lall et al.

It is certified that error appears in the above-identified patent and that said Letters Patent is hereby corrected as shown below:

Column 6,  
Line 19, "inverter: and" should be -- inverter; and --.

Column 7,  
Line 6, "second object n-channel width" should be -- second n-channel width --.  
Line 50, "said inverter, and" should be -- said inverter; and --.

Column 8,  
Line 50, "said inverter: and" should be -- said inverter; and --.  
Line 62, "MOSFET and" should be -- MOSFET, and --.

Column 10,  
Line 51, "stage including;" should be -- stage including: --.

Signed and Sealed this

Twenty-fifth Day of February, 2003

JAMES E. ROGAN  
*Director of the United States Patent and Trademark Office*